US005532500A

United States Patent [19]
Okamura et al.

[11] Patent Number: 5,532,500
[45] Date of Patent: Jul. 2, 1996

[54] SEMICONDUCTOR INTEGRATED CIRCUIT DEVICE HAVING CLOCK SIGNAL WIRING CONSTRUCTION FOR SUPPRESSING CLOCK SKEW

[75] Inventors: Hitoshi Okamura; Shin-Ichi Ohkawa, both of Tokyo, Japan

[73] Assignee: NEC Corporation, Tokyo, Japan

[21] Appl. No.: 294,826

[22] Filed: Aug. 26, 1994

[30] Foreign Application Priority Data

Sep. 1, 1993 [JP] Japan .................................. 5-217126

[51] Int. Cl.$^6$ ................................. H01L 23/482
[52] U.S. Cl. ........................ 257/207; 257/211; 257/773
[58] Field of Search ................................. 257/203, 207, 257/208, 211, 202, 758, 750, 773, 737, 738

[56] References Cited

U.S. PATENT DOCUMENTS

| | | | |
|---|---|---|---|
| 4,958,092 | 9/1990 | Tanaka | 307/480 |
| 5,060,045 | 10/1991 | Owada et al. | 257/211 |
| 5,254,886 | 10/1993 | El-Ayat et al. | 307/465 |

FOREIGN PATENT DOCUMENTS

| | | | |
|---|---|---|---|
| 0087744 | 4/1988 | Japan | 257/208 |
| 0077150 | 3/1990 | Japan | 257/203 |
| 0355952 | 12/1992 | Japan | 257/211 |

OTHER PUBLICATIONS

Saigo et al.; "Clock Skew Reduction Approach for Standard Cell"; IEEE 1990 Custom Integrated Circuits Conference CH 2860–5/90/0000/0087 1990 IEEE 16.4.1. to 16.4.4.

Jackson et al.; "Clock Routing for High–Performance ICs"; 27th ACM/IEEE Design Automation Conference; 1990 IEEE 0738–100X/90/0006/0573; pp. 573–579.

*Primary Examiner*—Peter Toby Brown
*Attorney, Agent, or Firm*—Whitham, Curtis, Whitham & McGinn

[57] ABSTRACT

In a semiconductor integrated circuit device, a clock signal wiring for transmitting a clock signal to flip-flops is constituted from a plurality of trunk clock signal lines connected to a clock driver, and a plurality of clock signal branch lines branching from the trunk clock signal lines. The flip-flops may be connected directly or indirectly via the clock signal branch lines to the trunk clock signal lines. In this instance, one of a pair of terminal ends of each trunk clock signal line is connected to the clock driver while the other terminal end is set as an open end, and the transmission loss in the trunk clock signal line is sufficiently small. Accordingly, as reflected waves of the input clock signal at both terminal ends are present in trunk clock signal line and the voltage waveform in trunk clock signal line presents a composite waveform of the incident wave and the reflected waves, the clock skew in the semiconductor integrated circuit device is suppressed to a very low level even where the semiconductor integrated circuit device is formed as a large scale integrated circuit.

8 Claims, 9 Drawing Sheets at 99.0 psec. (3/4 τ)

at 133.2 psec. (τ)

SEMICONDUCTOR INTEGRATED CIRCUIT DEVICE HAVING CLOCK SIGNAL WIRING CONSTRUCTION FOR SUPPRESSING CLOCK SKEW

BACKGROUND OF THE INVENTION

1. Field of the Invention

This invention relates to a semiconductor integrated circuit device, and more particularly to a semiconductor integrated circuit device having a clock signal wiring construction for suppressing a clock skew.

2. Description of the Related Art

FIG. 1 is a plan view showing a conventional example of a clock signal wiring line structure of a semiconductor integrated circuit device. In the conventional semiconductor integrated circuit device 40, flip-flops 43 and 44 in a clock synchronizing circuit are driven by a circuit having a tree structure constituted from parent clock driver 45 and child clock drivers 46 driven by parent clock driver 45. A clock signal applied to clock input terminal 47 is transmitted to flip-flops 43 and 44 after a delay time which is caused by self delay times of parent clock driver 45 and child clock drivers 46 as well as the wiring resistance and capacitance of clock signal wiring 48 and the clock input terminal capacitances of flip-flops 43 and 44.

In the conventional semiconductor integrated circuit device, if the wiring layers or the wiring lengths of the paths from the clock drivers to the individual flip-flops are different from each other or there is some imbalance between the numbers of flip-flops driven by the individual child clock drivers, then the individual paths have different peculiar signal propagation times, which cause a clock signal transmission delay difference (hereinafter referred to as clock skew) between the paths.

In recent years, since the scale of semiconductor integrated circuits has been and is increasing, it becomes difficult to lay the wiring in the same layer or to equalize the wiring lengths of individual paths from clock drivers to flip-flops. Further, as the refinement of the manufacturing process for semiconductor integrated circuit devices proceeds, also the increase of wiring resistances of paths of the devices causes an increase of the clock skew.

As a result, the conventional semiconductor integrated circuit is disadvantageous in that, when the clock frequency is raised, a malfunction is caused by a timing error arising from the clock skew.

SUMMARY OF THE INVENTION

It is an object of the present invention to provide a semiconductor integrated circuit device having a clock signal wiring construction which can suppress the clock skew to a minimum value eliminating the disadvantage of the clock signal wiring construction of the conventional semiconductor integrated circuit device described above.

In accordance with the present invention, there is provided a semiconductor integrated circuit device which comprises a plurality of trunk clock signal lines formed in at least one wiring layer of a plurality of wiring layers on a semiconductor substrate, a plurality of clock signal branch lines connected to the trunk clock signal lines, formed in the same or other layer with the trunk clock signal lines and having a line width and a line film thickness smaller than those of the trunk clock signal line, and a plurality of circuit elements each having a clock input terminal connecting directly to the trunk clock signal line or indirectly by way of the clock signal branch line to the trunk clock signal line. One of a pair of terminals of each trunk clock signal line is connected to a clock driver while the other terminal of the trunk clock signal line is open-ended so that the signal reflection coefficient at the open-ended terminal of the trunk clock signal line is substantially sufficiently high.

The trunk clock signal lines or the clock signal branch lines may have two or more wiring layers.

The trunk clock signal lines may be formed in the upper layer other than that of the clock signal branch wiring lines.

The trunk clock signal line may form a wiring layer in the same layer as a bump metal layer to be used for tape automated bonding mounting.

The semiconductor integrated circuit device may be so constructed that an integral number of times a value obtained by dividing four times the length of the trunk clock signal line by the propagation speed of the clock voltage waveform which advances in the trunk clock signal line is substantially equal to the rising or falling time of the clock voltage waveform.

DETAILED DESCRIPTION OF THE PREFERRED EMBODIMENT

The present embodiment is described below with reference to the drawings.

Figure 1:
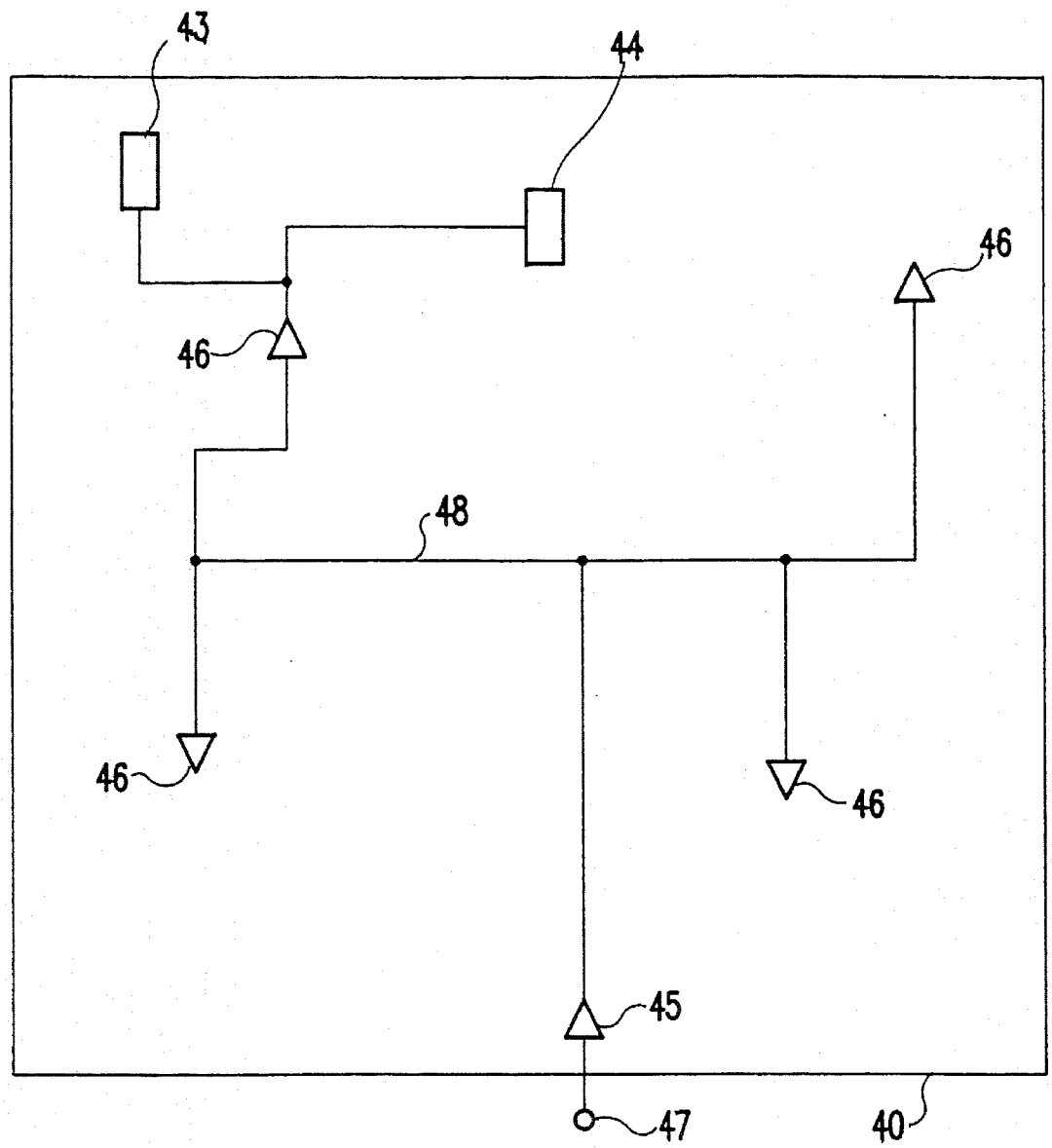
FIG. 1 is a plan view showing a conventional example of a clock signal wiring structure of a semiconductor integrated circuit device.
Figure 2:
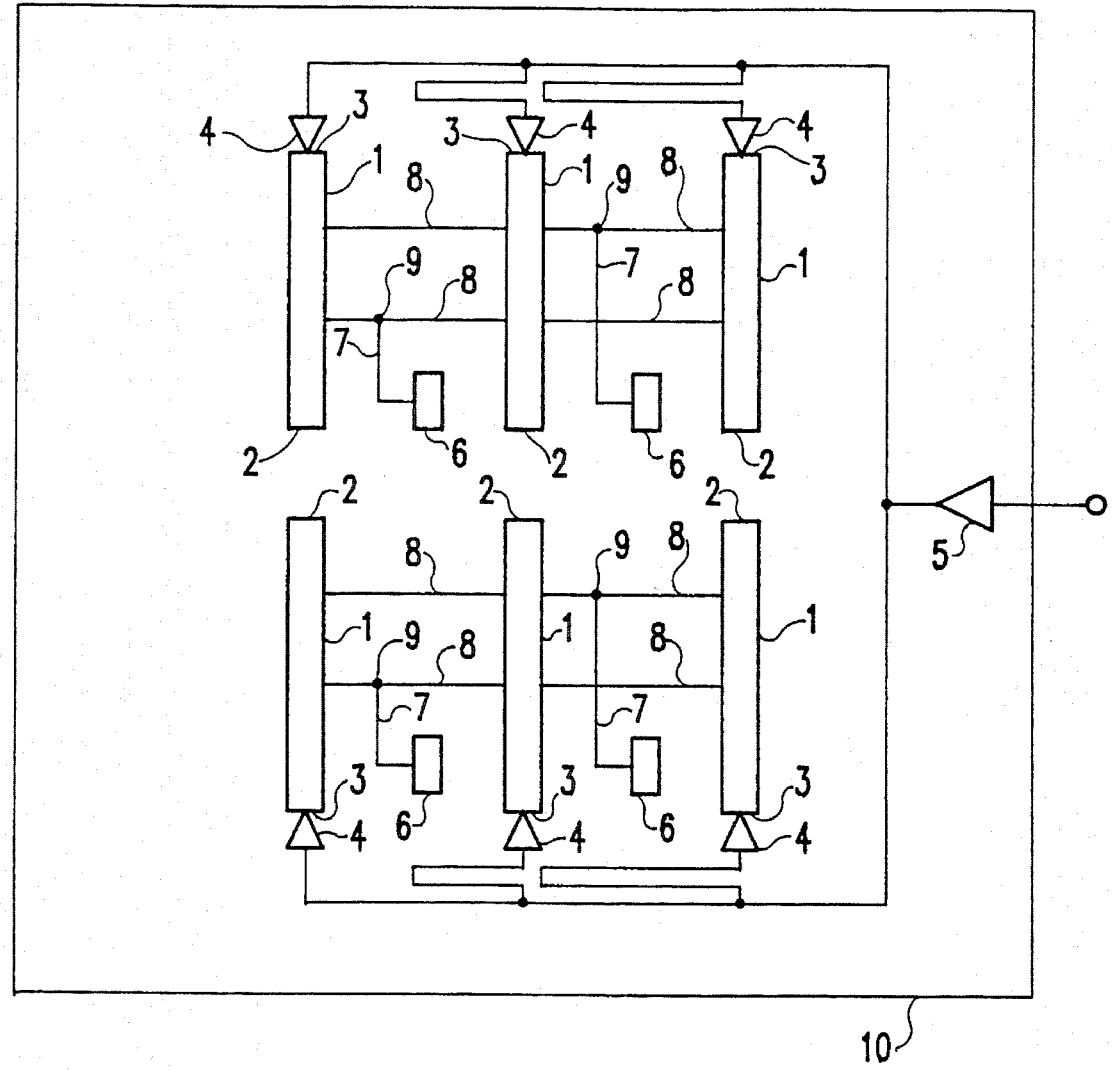
FIG. 2 is a plan view showing an embodiment of a semiconductor integrated circuit device having a clock signal wiring structure of the present invention.
Figure 6:
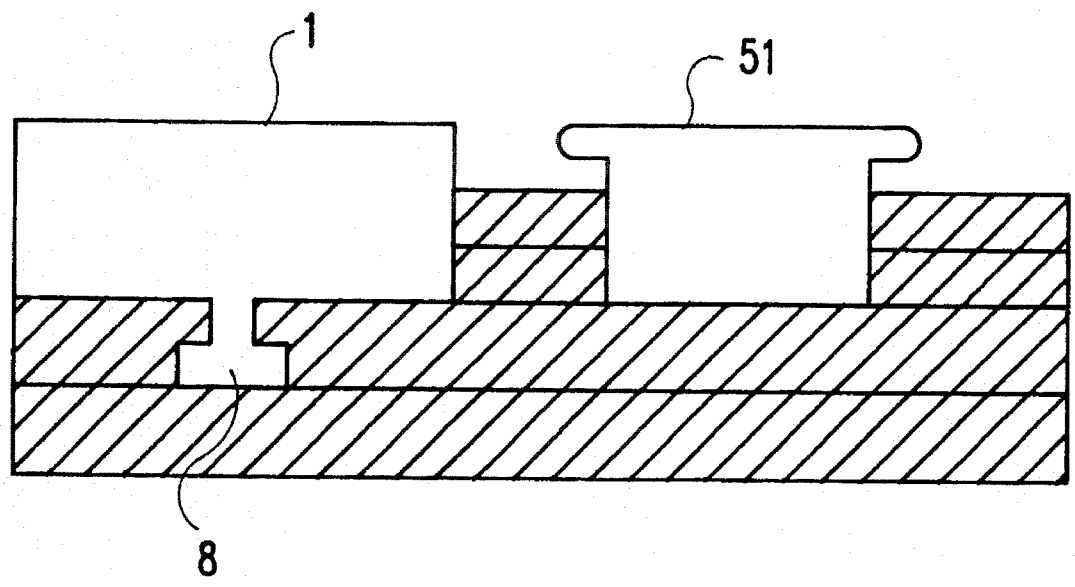
FIG. 6 is a cross sectional view showing an embodiment of the present invention wherein a trunk clock signal line forms a wiring layer in a same layer as a bump metal layer to be used for tape-automated bonding.

Referring to FIGS. 2 & 6, the semiconductor integrated circuit device 10 of the present embodiment includes six trunk clock signal lines 1 of 10 μm thick, 34 μm wide and 5 mm long formed on the same layer as a bump metal layer 51 for use for TAB (tape automated bonding) mounting and arranged in two rows each including three trunk clock signal wiring lines 1, four clock signal branch lines 8 connected between trunk clock signal lines 1 and flip-flops 6 connected to clock signal branch lines 8. The resistance of trunk clock signal lines 1 is 0.1Ω per 1 mm in length and very low.

Figure 7A:
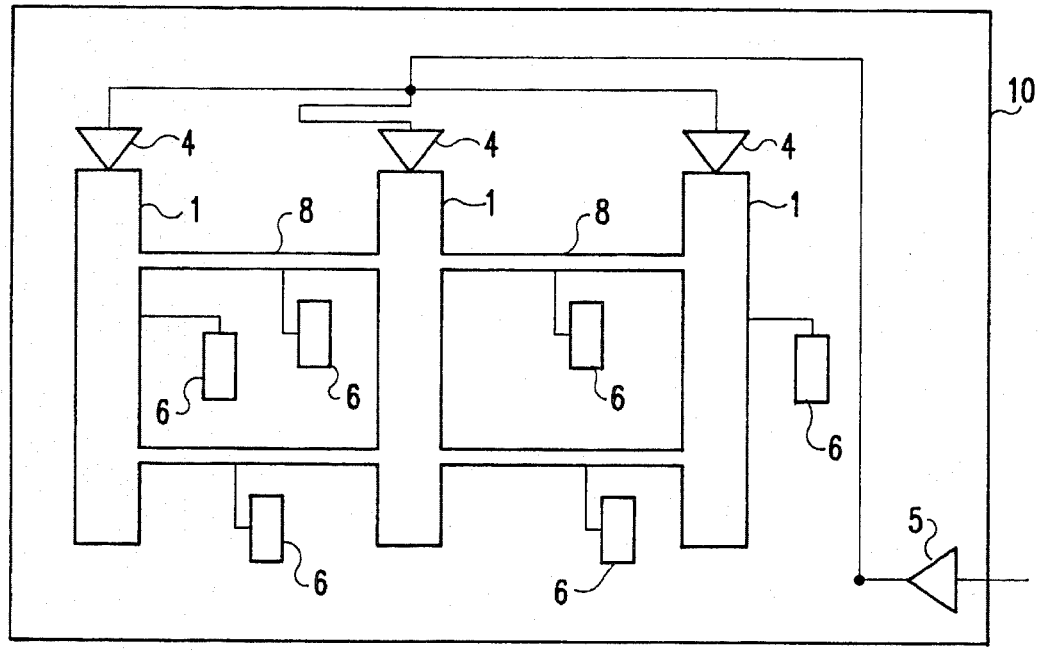
FIG. 7A is a plan view of an embodiment of the present invention wherein circuit elements are shown connected directly to a clock trunk signal line and indirectly by way of a branch clock signal line to the clock trunk signal line.

As shown in FIG. 7A, flip-flops 6 can be connected directly to a clock trunk signal line 1 and indirectly by way of a branch clock signal line 8 to the clock trunk signal line 1. One terminal 2 of each trunk clock signal line 1 is an open end while the other terminal 3 is connected to an output terminal of clock buffer 4. The clock skew at the input terminal of each child clock buffer 4 is suppressed sufficiently small by forming clock signal lines between each of child clock buffers 4 and parent clock driver 5 as equal length to each other. A clock signal supplied from parent clock driver 5 to each trunk clock signal line 1 by way of child clock buffer 4 propagates in trunk clock signal line 1 at propagation speed v given by $$v = c/\sqrt{\epsilon\mu} \quad (1)$$

where c is the light velocity, ε is the dielectric constant, and μ is the permeability. Accordingly, supposing that the dielectric constant ε of an oxide film surrounding each trunk clock signal line is 4, then since μ=1, propagation velocity v of the clock signal is about $1.5 \times 10^8$ m/sec which is one half the light velocity.

Therefore, propagation over the line length of 5 mm requires about 33.3 psec.

Figure 3A:
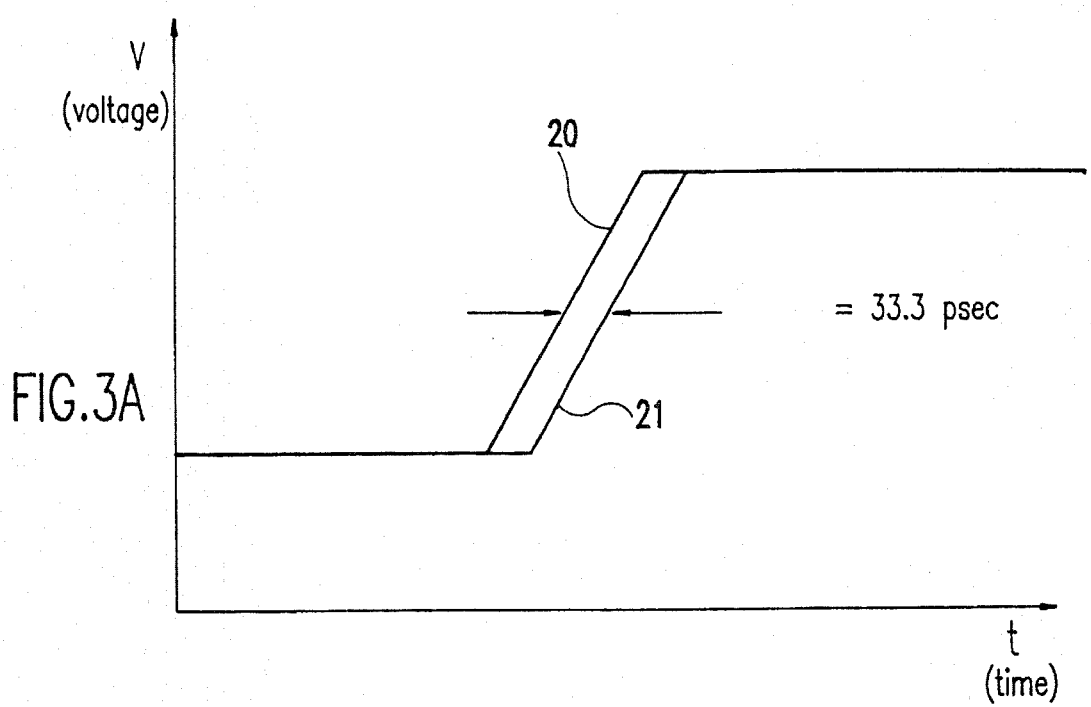
FIG. 3(a) is a diagram indicating a result of simulation showing a clock signal voltage waveform where a terminal end of a trunk clock signal line is grounded by way of a resistor in the embodiment shown in FIG. 2.
Figure 3B:
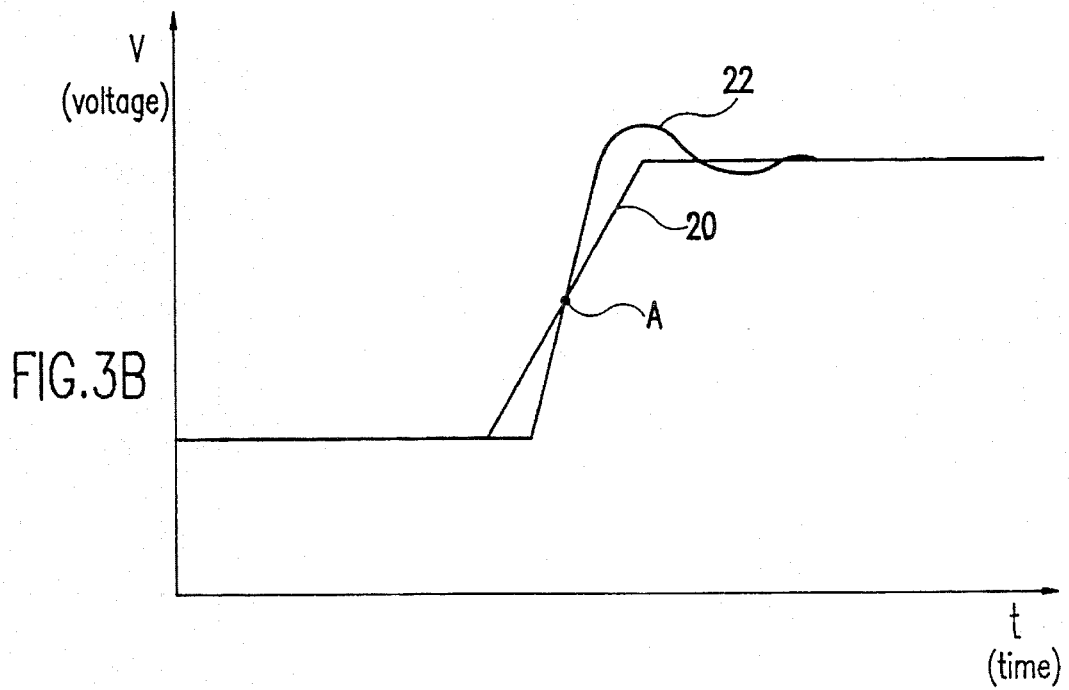
FIG. 3(b) is a similar view but indicating a result of simulation showing a clock signal voltage waveform when the terminal end of the trunk clock signal line is formed as an open end in the embodiment shown in FIG. 2.

FIGS. 3(a) and 3(b) show simulation waveforms illustrating conditions of signal propagation in each trunk clock signal line in the embodiment.

In FIG. 3(a), clock waveform 20 at input terminal 3 of each trunk clock signal line 1 and clock waveform 21 at terminal end 2 of each trunk clock signal line 1 are shown, and the difference between clock waveforms 20 and 21 represents the propagation delay of the clock signal wave in trunk clock signal line 1.

Figure 4:
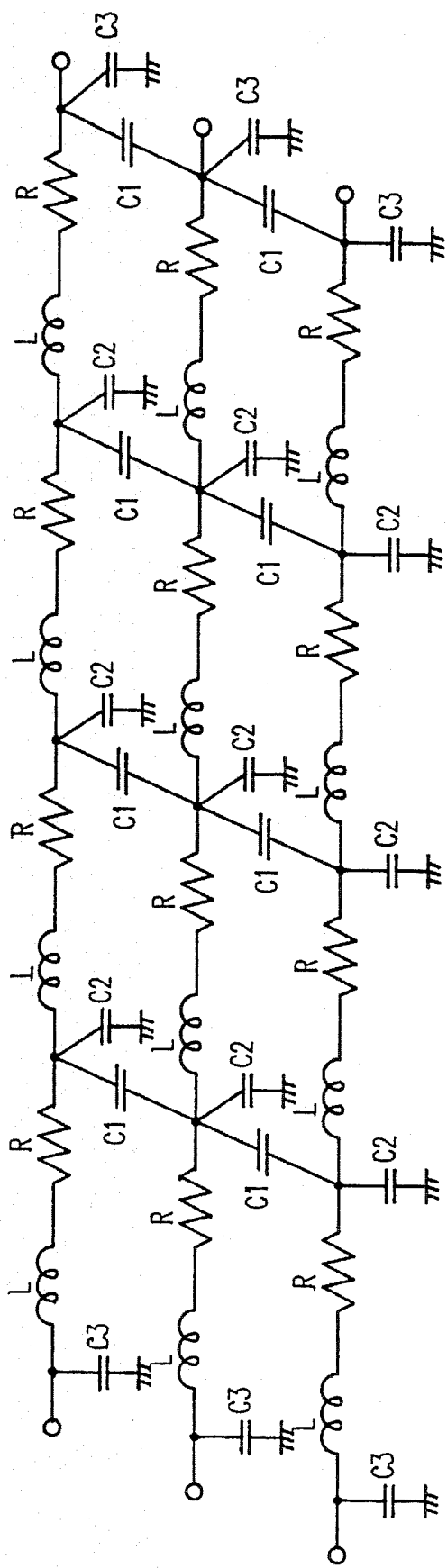
FIG. 4 is a wiring diagram showing a clock tree SPICE simulation model utilizing reflected waves which was used for the simulation of the voltage waveforms in the trunk clock signal line shown in FIGS. 3(a) and 3(b)

This result was obtained by connecting terminal end 2 of trunk clock signal line 1 to the ground by way of a resistor, modeling trunk clock signal line 1 making use of the values of line capacities (C1, C2 and C3), line resistance (R) and line inductance (L) of trunk clock signal wiring line 1 as shown in FIG. 4 and simulating, by SPICE simulation, a manner in which the modeled trunk clock signal line is driven by an ECL clock driver (not shown). The rising time of input clock waveform 20 is 133.2 psec. (33.3 psec.×4).

Meanwhile, FIG. 3(b) shows SPICE simulation waveforms when terminal end 2 of trunk clock signal line 1 is set as an open end as intended by the present invention. From FIG. 3(b), it can be seen that, when one half the signal amplitude of clock waveform 20 is used as a threshold level, propagation in trunk clock signal line 1 does not undergo any propagation delay at point A. This phenomenon is described below with reference to FIGS. 3(b) and 5.

Figure 5A:
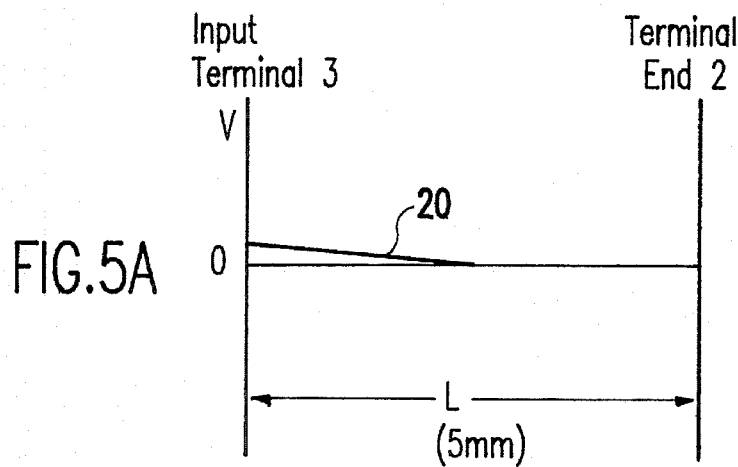
FIGS. 5(a) to (h) show transition of the clock signal voltage waveform advancing in trunk clock signal line 1.
Figure 5B:
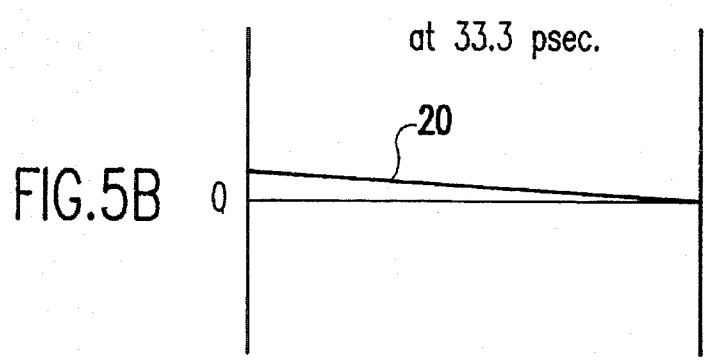
Figure 5C:
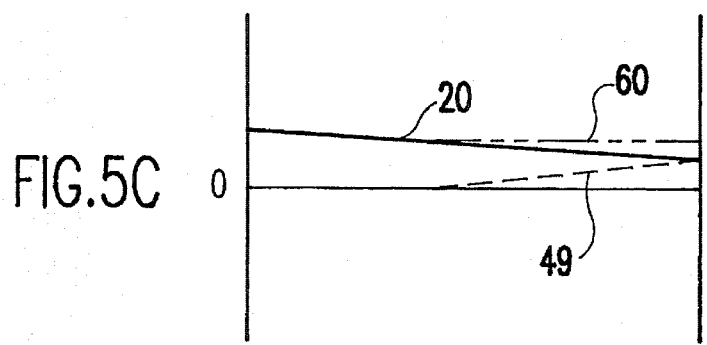

Clock signal 20 inputted to input terminal 3 of trunk clock signal line 1 advances at a velocity v in trunk clock signal line 1 (FIG. 5(a)) and arrives at terminal end 2 of the trunk clock signal line of length L (FIG. 5(b)), with which the resistance can be ignored, after time tT (=L/v, 33.3 psec.). Clock signal 20 is reflected at terminal end 2 and first terminal end reflected wave 49 advances in the reverse direction in trunk clock signal line 1 at an equal velocity to that of the incident wave (FIG. 5(c)). Now, if the transmission loss of clock signal 20 in trunk clock signal line 1 is ignored and it is assumed that the reflection at terminal end 2 is total reflection, then the voltage waveform of composite wave 60 of input clock signal 20 and first terminal end reflected wave 49 will rise at the speed twice that of inputted clock voltage waveform 20. Time t2 at which the rising speed of the clock waveform begins to be doubled is represented, at the position of distance x from input terminal 3, by next equation (2)

$$t2 = (2L-x)/v \quad (2)$$

Figure 5D:
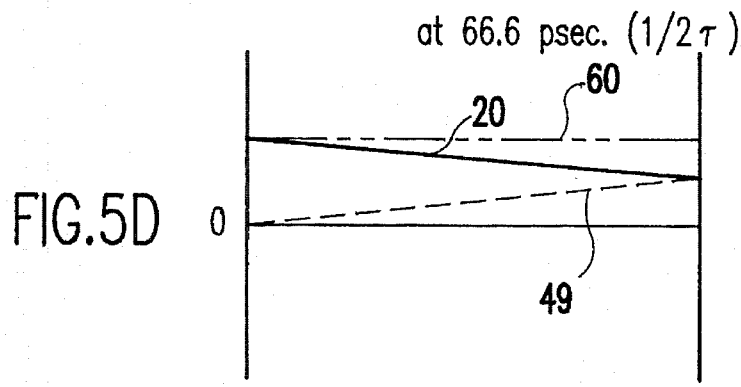

First terminal end reflection wave 49 arrives at input terminal 3 at time 2L/v (66.6 psec., FIG. 5(d)).

Figure 5E:
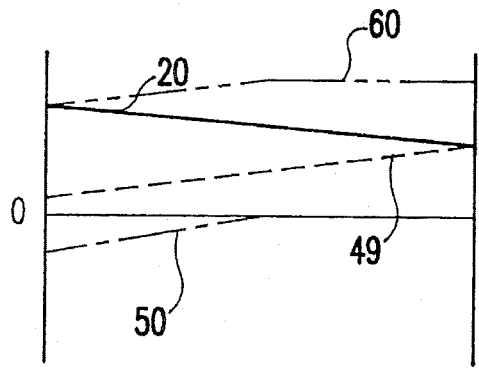

Since the input terminal terminates with an impedance which depends upon a transistor or some other element and trunk clock signal line 1 is driven by the clock driver circuit, first terminal end reflection wave 49 is reflected by fixed end reflection at input terminal 3 and first input terminal reflected wave 50 advances at the same velocity in the same direction as input wave 20 (FIG. 5(e)). Since the wave height of first input terminal reflected wave 50 then has a sign opposite to that of first terminal end reflected wave 49, if total reflection is presumed, first terminal end reflection wave 49 and first input terminal reflection wave 50 cancel each other. Accordingly, the rising speed of composite wave 60 of them is equal to the rising speed of input clock signal 20. Time t1 at which the rising speed of the voltage at the position of distance x from input terminal 3 becomes equal to the rising speed of input clock signal 20 is given by next equation (3)

$$t1 = (2L+x)/v \quad (3)$$

Figure 5F:
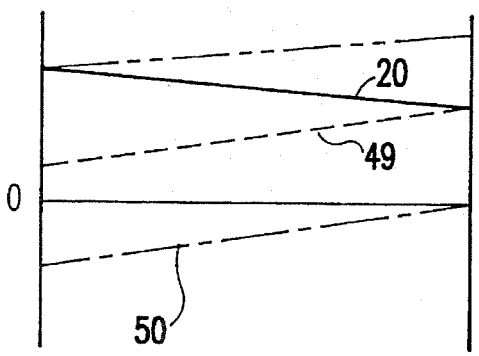
Figure 5G:
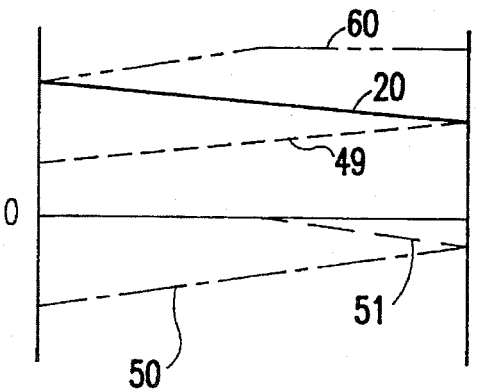

Further, first input terminal reflection wave 50 arrives at the terminal end after time 3L/v (99.9 psec., FIG. 5(f)). First input terminal reflection wave 50 is reflected by open end complete reflection at terminal end 2 and makes second terminal end reflection wave 51. This second terminal end reflection wave 51 advances in the same direction as first terminal end reflection wave 49 with a wave height of a sign opposite to that of first terminal end reflection wave 49 (FIG. 5(g)). Then, composite wave 60 is constituted from two voltage waveforms having the positive sign and two other voltage waveforms having the negative sign, and since the absolute values of the speeds of the potential variations of them are all equal, the rising speed of composite waveform 60 is zero. Time t0 at which the voltage waveform becomes fixed, that is, the rising speed is reduced to 0, at the position of distance x from input terminal 3 is given by next equation (4).

$$t0 = (4L-x)/v \quad (4)$$

Figure 5H:
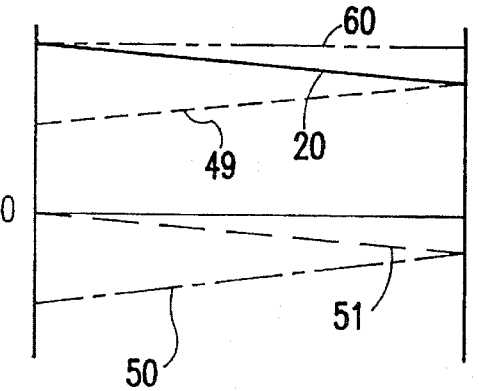

After time 4L/v (133.2 psec., FIG. 5(h)), second terminal end reflected wave 51 arrives at input terminal 3 and, successively, the phenomenon described above is repeated in trunk clock signal line 1.

In this manner, the voltage at a certain point in trunk clock signal line 1 rises repeating small oscillations while varying the rising speed within the range from 0 to twice the rising speed of input clock signal 20 in period τ (=4L/v).

Accordingly, when the rising time of input clock waveform 20 is sufficiently long comparing with period τ (=4L/v) of the small vibrations, the clock skew is reduced within a magnitude of L/v that can be practically ignored.

Particularly when the input signal rising time is equal to an integral number of times period τ (=4L/v), the voltage distribution in trunk clock signal line 1 in terms of the voltage point of one half the amplitude of the clock waveform is fixed, and the clock skew in trunk clock signal line 1 disappears completely.

FIG. 5 shows a diagram where L=5 mm and the rising time of the clock waveform is 133.2 psec. (33.3 psec.×4), that is, the input signal rising time is equal to one period τ. It can be seen from FIG. 5 that the potentials at points at the time of 66.6 psec. (corresponding to point A in FIG. 3(a)) at which the voltage of the clock input signal becomes equal to one half the amplitude are all equal to each other. The explanation described above also applies to the cases in which the input signal rising time is equal to an integral number of times period τ.

If wiring lines 7 to flip-flops 6 in the semiconductor integrated circuit are laid from trunk clock signal lines 1 or clock signal branch lines 8 connected between trunk clock signal lines 1, then the so-called clock skews involve only delay time differences which arise from total imbalance of resistances and capacitances of wiring lines 7 and clock signal branch lines 8 to flip-flops 6 and input capacitances of flip-flops 6 connected to terminals 9. Consequently, remarkable reduction in clock skew is realized.

As described above, according to the present invention, since a semiconductor integrated circuit device has a clock signal line structure which comprises a plurality of trunk clock signal lines each having a sufficiently great line width and line thickness and having a reduced line resistance and a plurality of clock signal branch lines each connected to the trunk clock signal line and wherein one of a pair of terminals of each trunk clock signal line is connected to a clock driver while the other terminal of each trunk clock signal line is open-ended so that the signal reflection coefficient at the open-ended terminal of the trunk clock signal line is sufficiently high, the clock skew in the semiconductor integrated circuit device can be suppressed to a very low level even where the semiconductor integrated circuit device is formed as a large scale integrated circuit.

Figure 7B:
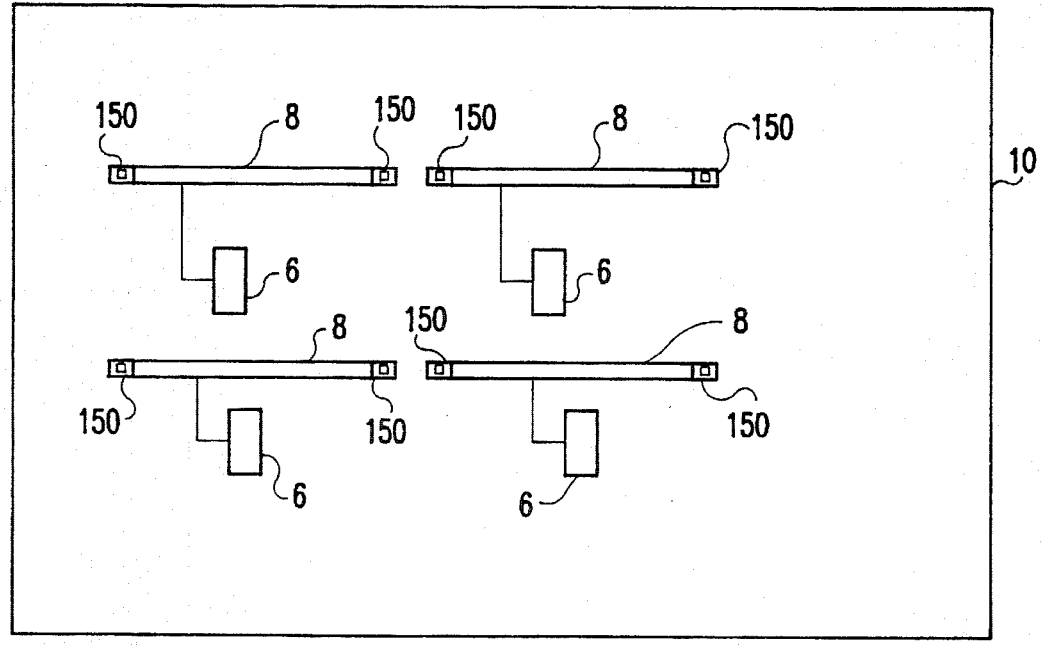
FIG. 7B is a plan view of an embodiment of the present invention wherein a branch clock signal line is shown in a layer separate from a clock trunk signal line.
Figure 8:
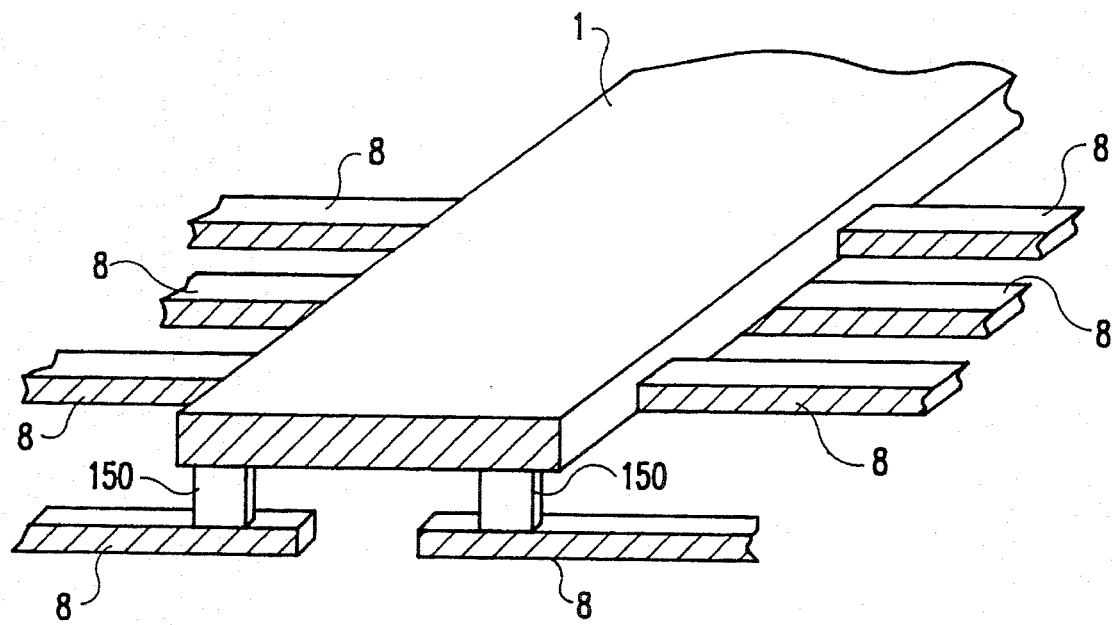
FIG. 8 is a partial perspective view of an embodiment of the present invention wherein clock signal branch lines are shown formed in two wiring layers.

Since LSIs in recent years usually comprise multi-layer structures of two or more layers (see e.g., FIGS. 7B & 8 having through holes labeled 150), trunk clock signal lines 1 and/or clock signal branch lines 8 can be formed as wiring lines of two or more layers (see e.g., FIG. 8). Further, generally since an upper wiring layer has a greater wiring film thickness, if the trunk clock signal lines are formed in an upper layer other than a layer of the clock signal branch lines, then the width of the trunk clock signal lines need not be made unnecessarily great and reduction of the chip area can be achieved.

What is claimed is:

1. A semiconductor integrated circuit device, comprising:

a plurality of trunk clock signal lines formed in at least one wiring layer of a plurality of wiring layers on a semiconductor substrate;

a plurality of clock signal branch lines connected to said trunk clock signal lines, formed in one of a same layer and another layer with said trunk clock signal lines and having a line width and a line film thickness smaller than those of said trunk clock signal lines; and a plurality of circuit elements each having a clock input terminal connecting one of directly to said trunk clock signal line and indirectly by way of said clock signal branch line to said trunk clock signal line, wherein one of a pair of terminals of each trunk clock signal line is connected to a clock driver including an emitter-coupled logic (ECL), while the other terminal of said trunk clock signal line is open-ended so that the signal reflection coefficient at the open-ended terminal of said trunk clock signal line is substantially sufficiently high and a reflected clock signal is in a same phase with the clock signal inputted thereto while a reflected clock signal at the clock driver side terminal is in a phase opposite that of the reflected clock signal inputted thereto, and wherein each trunk clock signal line has a length such that a respective rising and falling time of the clock voltage waveform is longer compared to a value represented by an integer multiplied by a value obtained by dividing four multiplied by the length of said trunk clock signal line by a propagation speed of the clock voltage waveform which advances in said trunk clock signal line.

2. A semiconductor integrated circuit device as claimed in claim 1, wherein one of said trunk clock signal lines and said clock signal branch lines is formed in at least two wiring layers.

3. A semiconductor integrated circuit device as claimed in claim 1, wherein said trunk clock signal lines are formed in an upper layer other than that of said clock signal branch lines.

4. A semiconductor integrated circuit device as claimed in claim 1, wherein said trunk clock signal line forms a wiring layer in a same layer as a bump metal layer to be used for tape automated bonding mounting.

5. A semiconductor integrated circuit device, comprising:

a plurality of trunk clock signal lines formed in at least one wiring layer of a plurality of wiring layers on a semiconductor substrate;

a plurality of clock signal branch lines connected to said trunk clock signal lines, formed in one of a same layer and another layer with said trunk clock signal lines and having a line width and a line film thickness smaller than those of said trunk clock signal lines; and a plurality of circuit elements each having a clock input terminal connected directly to said trunk clock signal line and indirectly by way of said clock signal branch line to said trunk clock signal line;

wherein one of a pair of terminals of each trunk clock signal line is connected to a clock driver including an emitter-coupled logic (ECL), while the other terminal of said trunk clock signal line is open-ended so that the signal reflection coefficient at the open-ended terminal of said trunk clock signal line is substantially sufficiently high and a reflected clock signal is in a same phase with the clock signal inputted thereto while a reflected clock signal at the clock driver side terminal is in a phase opposite that of the reflected clock signal inputted thereto, and wherein each of said trunk clock signal lines includes a length such that each of a respective rising and falling time of the clock voltage waveform is substantially equal to a value represented by an integer multiplied by a value obtained by dividing four multiplied by the length of said trunk clock signal line by a propagation speed of the clock voltage waveform which advances in said trunk clock signal line.

6. A semiconductor integrated circuit device as claimed in claim 5, wherein one of said trunk clock signal lines and said clock signal branch lines is formed in at least two wiring layers.

7. A semiconductor integrated circuit device as claimed in claim 5, wherein said trunk clock signal lines are formed in an upper layer other than that of said clock signal branch lines.

8. A semiconductor integrated circuit device as claimed in claim 5, wherein said trunk clock signal line forms a wiring layer in a same layer as a bump metal layer to be used for tape automated bonding mounting.

* * * * *